(12) United States Patent
Noda et al.

(10) Patent No.: US 6,750,506 B2
(45) Date of Patent: Jun. 15, 2004

(54) HIGH-VOLTAGE SEMICONDUCTOR DEVICE

(75) Inventors: Masaaki Noda, Shiga (JP); Teruhisa Ikuta, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/736,230

(22) Filed: Dec. 15, 2000

(65) Prior Publication Data
US 2001/0004124 A1 Jun. 21, 2001

(30) Foreign Application Priority Data
Dec. 17, 1999 (JP) ............................................. 11-359273

(51) Int. Cl.$^7$ ........................ H01L 27/108; H01L 29/76
(52) U.S. Cl. ........................ 257/328; 257/298; 257/315; 257/316; 257/319; 257/320; 257/326; 257/296; 257/300; 257/401; 257/335; 257/488; 257/489; 257/490; 365/185.01; 365/185.07
(58) Field of Search ........................ 257/401, 296–300, 257/315–320, 328, 335, 488–490, 339, 367, 469, 341, 410, 411, 321, 409, 314; 365/185.01, 185.07

(56) References Cited
U.S. PATENT DOCUMENTS 4,290,077 A * 9/1981 Ronen .......................... 357/41
5,432,740 A * 7/1995 D'Arrigo et al. ............ 365/185
5,510,639 A * 4/1996 Okuda et al. ................ 257/317
5,544,103 A * 8/1996 Lambertson ................ 365/185
6,121,655 A * 9/2000 Odanaka et al. ............ 257/315
6,310,374 B1 * 10/2001 Satoh et al. ................ 257/298

FOREIGN PATENT DOCUMENTS

| JP | 61-168253 | 7/1986 |
| JP | 07-135307 | 5/1995 |
| JP | 2556175 | 9/1996 |
| JP | 10-242454 | 9/1998 |
| JP | 11-251597 | 9/1999 |

* cited by examiner

Primary Examiner—Jerome Jackson
Assistant Examiner—Joseph Nguyen
(74) Attorney, Agent, or Firm—Nixon Peabody LLP; Donald R. Studebaker

(57) ABSTRACT

A high-voltage semiconductor device includes: a drain region; a metal electrode electrically connected to the drain region; and electrically floating plate electrodes formed on a field insulating film over a semiconductor regionm. Parts of the metal electrodes are extended onto the interlevel dielectric film and located over the respective plate electrodes. Each part of the metal electrode is capacitively coupled to associated one of the plate electrodes.

8 Claims, 13 Drawing Sheets

HIGH-VOLTAGE SEMICONDUCTOR DEVICE

BACKGROUND OF THE INVENTION

The present invention relates to a semiconductor device with a high breakdown voltage (which will be herein called a "high-voltage semiconductor device").

Hereinafter, a known high-voltage semiconductor device will be described with reference to FIG. 14. FIG. 14 is a perspective view schematically illustrating a cross-sectional structure for an insulated-gate transistor.

As shown in FIG. 14, the transistor includes a p-type semiconductor substrate 1. In the substrate, n-type lightly doped semiconductor region 2, p-type doped isolating region 3, p-type doped body region 4 and n-type heavily doped source/drain regions 5 and 6 have been defined. These regions 2, 3, 4, 5 and 6 will be herein called "semiconductor region", "isolating region", "body region" and "source/drain regions", respectively, for the sake of simplicity. The isolating region 3 is provided to electrically isolate an adjacent pair of devices from each other. The body region 4 is defined in the semiconductor region 2, the source region 5 is defined in the body region 4 and the drain region 6 is defined in the semiconductor region 2.

An oxide film with non-uniform thicknesses has been deposited over the semiconductor region 2. A thinner portion of the oxide film is used as a gate oxide 7, while a thicker portion thereof is identified by the reference numeral 8. The oxide film 7, 8 is covered with an interlevel dielectric film 9. Electrodes 10b, 11b and 12b of polysilicon have also been formed over the oxide film 7, 8. Specifically, the electrode 10b functions as gate electrode, the electrode 11b is an electrically floating plate electrode, and the electrode 12b is a plate electrode connected to a drain electrode 15. It should be noted that parts of the interlevel dielectric film 9, which actually covers these electrodes 10b, 11b and 12b, are not illustrated in FIG. 14 to make the structure of this transistor easily understandable.

As also shown in FIG. 14, five other metal electrodes 13, 14, 15, 16 and 17 are also provided. Specifically, the electrode 13 is connected to the body region 4 and will be herein called a "body electrodes". The electrode 14 makes electrical contact with the source region 5 and will be herein called a "source electrode". The electrodes 16 and 17 are electrically floating electrodes. And the electrode 15 makes electrical contact with the drain region 6 and will be herein called a "drain electrode". Although not illustrated in FIG. 14, a protective coating has actually been deposited over the electrodes 13 through 17 and interlevel dielectric film 9, and the chip including these components is entirely covered with a plastic encapsulant.

In the structure illustrated in FIG. 14, a predetermined part of the n-type semiconductor region 2 is surrounded with the p-type isolating region 3 in the p-type semiconductor substrate 1. The drain region 6 is located approximately at the center of that part of the semiconductor region 2. Also, the p-type body region 4 has been defined along the isolating region 3, which defines the periphery of that part the semiconductor region 2. And the n-type source region 5 has been defined inside the body region 4.

In the insulated-gate transistor shown in FIG. 14, a ground potential GND is applied to the source electrode 14, body electrode 13, substrate 1 and isolating region 3, a positive high potential is applied to the drain electrode 15 and a control voltage is applied to the gate electrode 10b. The plate electrodes 11b and 12b, connected to the drain region 6, are a type of field plates. These plate electrodes 12b and 11b are capacitively coupled to the floating metal electrodes 16 and 17, respectively, through the interlevel dielectric film 9 over the electrodes 12b and 11b. In this manner, the potential difference between the drain and gate electrodes 15 and 10b is divided by the capacitive divider so that potential is not concentrated at a particular surface area in the semiconductor region 2.

Next, it will be briefly described how the insulated-gate transistor shown in FIG. 14 operates. When a positive voltage, equal to or higher than its threshold voltage, is applied as a control voltage to the gate electrode 10b, part of the p-type body region 4, located near the surface and under the gate electrode 10b, changes into the opposite type, or n-type. As a result, a so-called "channel region" is created to turn the insulated-gate transistor ON. In this case, a current flows from the drain region 6 toward the source region 5 by way of the semiconductor region 2 and channel region near the surface of the body region 4. Conversely, if the voltage applied to the gate electrode 10b is reduced to less than its threshold voltage, then the channel region shrinks its size considerably to turn the insulated-gate transistor OFF. As used herein, the "breakdown voltage" of a transistor means a voltage below which the transistor is kept OFF. Thus, a "high-voltage transistor" can be kept OFF even when a high bias voltage (e.g., 100 V or more) is applied thereto.

FIG. 15 illustrates parasitic capacitances formed in the high-voltage semiconductor device shown in FIG. 14. FIG. 16 illustrates potential profiles created when a high voltage (e.g., 600 V) is applied to the device shown in FIG. 14. In FIG. 16, each dashed line indicates an equipotential line.

As shown in FIG. 15, a parasitic capacitance C1 exists between the gate and floating metal electrodes 10b and 17. A parasitic capacitance C2 exists between the floating metal and plate electrodes 17 and 11b. A parasitic capacitance C3 exists between the plate and floating metal electrodes 11b and 16. And a parasitic capacitance C4 exists between the floating metal electrode 16 and plate electrode 12b connected to the drain potential. A serial circuit, formed by these parasitic capacitances C1 through C4, divides the potential difference, thereby regulating the potential at the plate electrode 11b and creating appropriate potential profiles in the semiconductor region 2. It should be noted that parasitic capacitances C5 and C6, formed between the metal electrodes 16 and 17 and plastic encapsulant 19 shown in FIG. 15, are normally considered non-existent as will be described later.

Referring to FIG. 16, potential profiles at room temperature in the known high-voltage semiconductor device are schematically illustrated. The present inventors confirmed that the potential profiles illustrated in FIG. 16 and results of simulations we carried out showed similar tendencies.

The profiles illustrated in FIG. 16 were obtained where a ground potential of 0 V was applied to the substrate 1, isolating region 3, body region 4, source region 5 and gate electrode 10a and a voltage of 600 V was applied to the drain region 6. The control voltage applied to the gate electrode 10b was actually around 10 V. However, since this value is much lower than 600 V applied to the drain electrode 15, the same profiles are obtained whether the control voltage is 0 V or 10 V. Thus, the control voltage is regarded as 0 V for convenience sake.

As shown in FIG. 16, when the same high potential as that applied to the drain region 6, i.e., 600 V, is applied to the plate electrode 12b, an intermediate potential between 600 V and 0 V will be applied to the plate electrode 11b. Accordingly, the equipotential lines, representing the potential profiles in the semiconductor region 2, extend almost vertically to the surface of the semiconductor region 2, and are distributed almost equidistantly from each other. As a result, the concentration of electric field in the semiconductor region 2 can be reduced and the breakdown voltage of the transistor can be kept sufficiently high.

However, if the device is operated at an elevated ambient temperature of 150° C. with a high voltage of 500 V or more (e.g., 600 V) continuously applied to the drain electrode 15, then the source-drain breakdown voltage (i.e., a breakdown voltage between the source and drain electrodes 14 And 15) decreases. This phenomenon can be simulated by a life test called a "high-temperature bias test". Generally speaking, as the voltage applied to the drain electrode 15 is increased, the decrease in breakdown voltage becomes more and more significant. Conversely, the lower the applied voltage, the less significant the decrease in breakdown voltage.

It is not yet completely clear how and why the source-drain breakdown voltage decreases during the high-temperature bias test. Thus, we have to infer the mechanism of the breakdown voltage decrease. Following is the conclusion of our inference.

In general, a semiconductor chip is packaged with a plastic encapsulant to prevent water or moisture from entering the plastic package. However, a novolac epoxy resin, a typical plastic encapsulant, contains 0.9% to 1.6% of hydroxyl (OH) groups. At an elevated temperature, these OH groups are activated and the plastic encapsulant 19, which is usually considered an insulator, becomes semi-insulating (i.e. electrically conductive at a high resistance).

In a high-voltage semiconductor device, a semiconductor chip is normally packaged with the plastic encapsulant 19 and multiple pads (not shown) on the chip are usually electrically connected to multiple external terminals (not shown, either) via metal fine wires (not shown, either). The ground potential of 0 V, supply voltage of 600 V and control signal are applied to those metal fine wires. Accordingly, when the plastic encapsulant 19 becomes semi-insulating through the above action of the activated OH groups, an intermediate potential between 600 V and 0 V is estimatingly applied to the surface of the protective coating 18. The intermediate potential is variable depending on the layout of the semiconductor chip in question. For example, where a ground pad (not shown) is located near the insulated-gate transistor on the chip and a power supply pad (not shown) is distant from the ground pad, part of the plastic encapsulant 19 over the insulated-gate transistor might be at an intermediate potential of about 100 V. In view of these respects, we estimated potential profiles that would be created if the interface between the protective coating 18 for the chip and the plastic encapsulant 19 had a potential of 100 V during the high-temperature bias test.

Hereinafter, the potential profiles at the time of the high-temperature bias test will be described with reference to FIG. 17. FIG. 17 illustrates the estimated potential profiles during the high-temperature bias test that was carried out at the same bias voltage as that applied for the room temperature profiles illustrated in FIG. 16. In FIG. 17, each dashed line indicates an equipotential line.

In FIG. 17, the floating metal electrode 17 is accompanied with not only the parasitic capacitances C1 and C2 but also with another parasitic capacitance C5 formed between the electrode 17 and plastic encapsulant 19 (see FIG. 15). In the same way, the other floating metal electrode 16 is accompanied with not only the parasitic capacitances C3 and C4 but also with another parasitic capacitance C6 formed between the electrode 16 and plastic encapsulant 19 (see FIG. 15). Accordingly, if the parasitic capacitance C5 or C6 has a value approximately equal to that of the sum of parasitic capacitances C1+C2 or C3+C4, then the plastic encapsulant 19 becomes semi-insulating during the high-temperature bias test. When a part of the plastic encapsulant 19 over the electrode 16 or 17 comes to have a potential of 100 V, the potential of the electrode 16, which was about 450 V at room temperature, decreases to about 300 V as being affected by the parasitic capacitance C6. In the same way, the potential of the electrode 17, which was about 150 V at room temperature, decreases to about 130 V as being affected by the parasitic capacitance C5. The potential at the plate electrode 11b, which was about 300 V at room temperature, also decreases to 200 V correspondingly. As a result, some of the equipotential lines, which cross the interface between the semiconductor region 2 and oxide film 8 and represent respective potentials of 200 V or more, bend toward the drain region 6 as shown in FIG. 17. And around the interface, the potential in the oxide film 8 becomes negative against the surface potential of the n-type semiconductor region 2.

Where part of the oxide film 8, located over the interface between the n-type semiconductor region 2 and oxide film 8, comes to have a negative potential in a high-temperature environment, Si—H bonds, Si—OH bonds and other bonds are broken in the interface, thus creating positive fixed charges. As for this phenomenon, see "Reliability Technology for Semiconductor Devices" published by Publisher of Japanese Union of Scientists and Engineers, for example. When the positive fixed charges are generated in the interface between the semiconductor region 2 and oxide film 8 by such a phenomenon, negative mobile charges are also created in the oxide film 8. The negative mobile charges in the oxide film 8 are attracted little by little to a positive high potential at the drain electrode 8 with time. As a result, the negative mobile charge density locally increases in a region of the oxide film 8 near the drain electrode 15, while the positive fixed charge density increases in the region where the negative mobile charges were originally created. A great number of negative charges exist in that region of the oxide film 8 over the interface and near the drain electrode 15. As a result, holes are attracted from the semiconductor region 2 toward that region, and the surface of the n-type semiconductor region 2 changes into the opposite type, or p-type, thus forming a p-type inversion layer 30. On the other hand, electrons are attracted from the semiconductor region 2 toward the region where the positive fixed charges remain, and the electron density locally increases in part of the semiconductor region 2 under the region with a high fixed charge density. As a result, an n-type accumulation layer 31 is formed near the surface of the semiconductor region 2.

Where the p-type inversion layer 30 and n-type accumulation layer 31 are formed in this way near the surface of the semiconductor region 2 as shown in FIG. 17, the electric field is locally concentrated at part of the p-type inversion layer 30 near the drain region 6. As a result, we believe, the breakdown voltage of the high-voltage semiconductor device decreases with time through such a mechanism.

Next, another known high-voltage semiconductor device will be described as a second prior art example with reference to FIG. 18. FIG. 18 illustrates a cross-sectional structure for a main part of a device according to the second prior art example. In FIG. 18, the same members as those of the first prior art example shown in FIG. 15 are identified by the same reference numerals and the description thereof will be omitted herein.

The device shown in FIG. 18 further includes p-type girdling regions 23 and 24 to have its breakdown voltage increased. Unlike the device of the first prior art example shown in FIG. 15, the device of the second prior art example does not have the floating metal electrodes 16 and 17 but includes the p-type girdling regions 23 and 24 in the n-type semiconductor region 2.

In the known device shown in FIG. 18, a parasitic capacitance C7 exists between the gate electrode 10b and girdling region 23. A parasitic capacitance C8 exists between the girdling region 23 and plate electrode 11b. A parasitic capacitance C9 exists between the plate electrode 11b and girdling region 24. And a parasitic capacitance C10 exists between the girdling region 24 and plate electrode 12b. A voltage applied between the drain and source electrodes 15 and 14 is divided by a serial circuit consisting of these parasitic capacitances C7 through C10, thereby defining potentials for the girdling regions 23 and 24 and plate electrode 11b. The potentials are determined probably this way at least at room temperature.

When the device with this structure is subjected to a high-temperature bias test as in the first prior art example, the plastic encapsulant 19 becomes semi-insulating. As a result, the surface of the protective coating 18 comes to have an intermediate potential between 600 V and 0 V. However, if the intermediate potential has decreased to 100 V, then the potential at the plate electrode 11b, which is about 300 V at room temperature, might decrease to about 200 V due to the existence of a parasitic capacitance C11 between the plastic encapsulant 19 and plate electrode 11b. In that case, the p-type inversion layer 30 is formed between the girdling regions 23 and 24 and these regions 23 and 24 become electrically conductive with each other. As a result, the breakdown voltage of the high-voltage semiconductor device adversely decreases.

SUMMARY OF THE INVENTION

It is therefore an object of the present invention to provide a highly reliable high-voltage semiconductor device, of which the source-drain breakdown voltage hardly decreases even when the device is operated at an elevated temperature.

An inventive high-voltage semiconductor device includes: semiconductor substrate of a first conductivity type; semiconductor region of a second conductivity type; source and drain regions of the second conductivity type; body region of the first conductivity type; gate insulating film; gate electrode; field insulating film; metal electrode; plate electrodes; and interlevel dielectric film. The semiconductor region is defined in the substrate. The drain region is defined approximately at the center of the semiconductor region. The body region is defined in the semiconductor region so as to be spaced apart from, and to surround, the drain region. The source region is defined in the body region. The gate insulating film is deposited over the body region. The gate electrode is formed on the gate insulating film. The field insulating film is deposited over a part of the semiconductor region between the body and drain regions. The metal electrode is electrically connected to the drain region. The plate electrodes are in an electrically floating plate state, and are spaced apart from, and surround, the drain region when the device is viewed from over the substrate. And the interlevel dielectric film is formed over the gate insulating film, the field insulating film and the plate electrodes. This device is characterized in that parts of the metal electrode are extended onto the interlevel dielectric film and located over the respective plate electrodes and that each said part of the metal electrode is capacitively coupled to an associated one of the plate electrodes.

In one embodiment of the present invention, when the device is viewed from over the substrate, the drain region may be approximately circular, while the body and source regions may be in the shape of rings that form concentric circles around the drain region.

In another embodiment of the present invention when the device is viewed from over the substrate, the drain region may be approximately circular, while the plate electrodes may be in the shape of rings that form concentric circles around the drain region. And the metal electrode may include, as the extended parts, a plurality of annular metal electrodes that are formed over the respective plate electrodes with the interlevel dielectric film interposed therebetween. Each said annular metal electrode may be electrically connected to the drain region.

In this particular embodiment, at least one of the annular metal electrodes may be smaller in width than an associated one of the plate electrodes that is capacitively coupled to the annular metal electrode.

Alternatively, the metal electrode may include a part that overlaps the entire upper surface of one of the plate electrodes, which is located closer to the drain region than any other one of the plate electrodes is, with the interlevel dielectric film interposed therebetween.

As another alternative, the more distant from the drain region each said annular metal electrode is, the smaller the width of the annular metal electrode may be.

In still another embodiment, a plurality of girdling regions of the first conductivity type may be defined in respective upper parts of the semiconductor region that are located under the plate electrodes.

In yet another embodiment, a plurality of girdling regions of the first conductivity type, which are in the shape of rings that form concentric circles around the drain region, may be defined in respective upper parts of the semiconductor region that are located under the plate electrodes.

In yet another embodiment, the device may further include an isolating region of the first conductivity type that surrounds the semiconductor region. And the semiconductor region may be electrically isolated using a junction formed between the semiconductor and isolating regions.

In an alternative embodiment, the device may further include an isolating insulating film that surrounds the semiconductor region. And the semiconductor region may be electrically isolated using the insulating film.

In still another embodiment, the device may further include an insulating layer formed on the substrate of the first conductivity type. And the semiconductor region of the second conductivity type may be defined on the insulating layer.

In yet another embodiment, the device may further include: a protective coating formed over the metal electrode and the interlevel dielectric film; and a plastic encapsulant formed on the protective coating.

DESCRIPTION OF THE PREFERRED EMBODIMENTS

Figure 1:
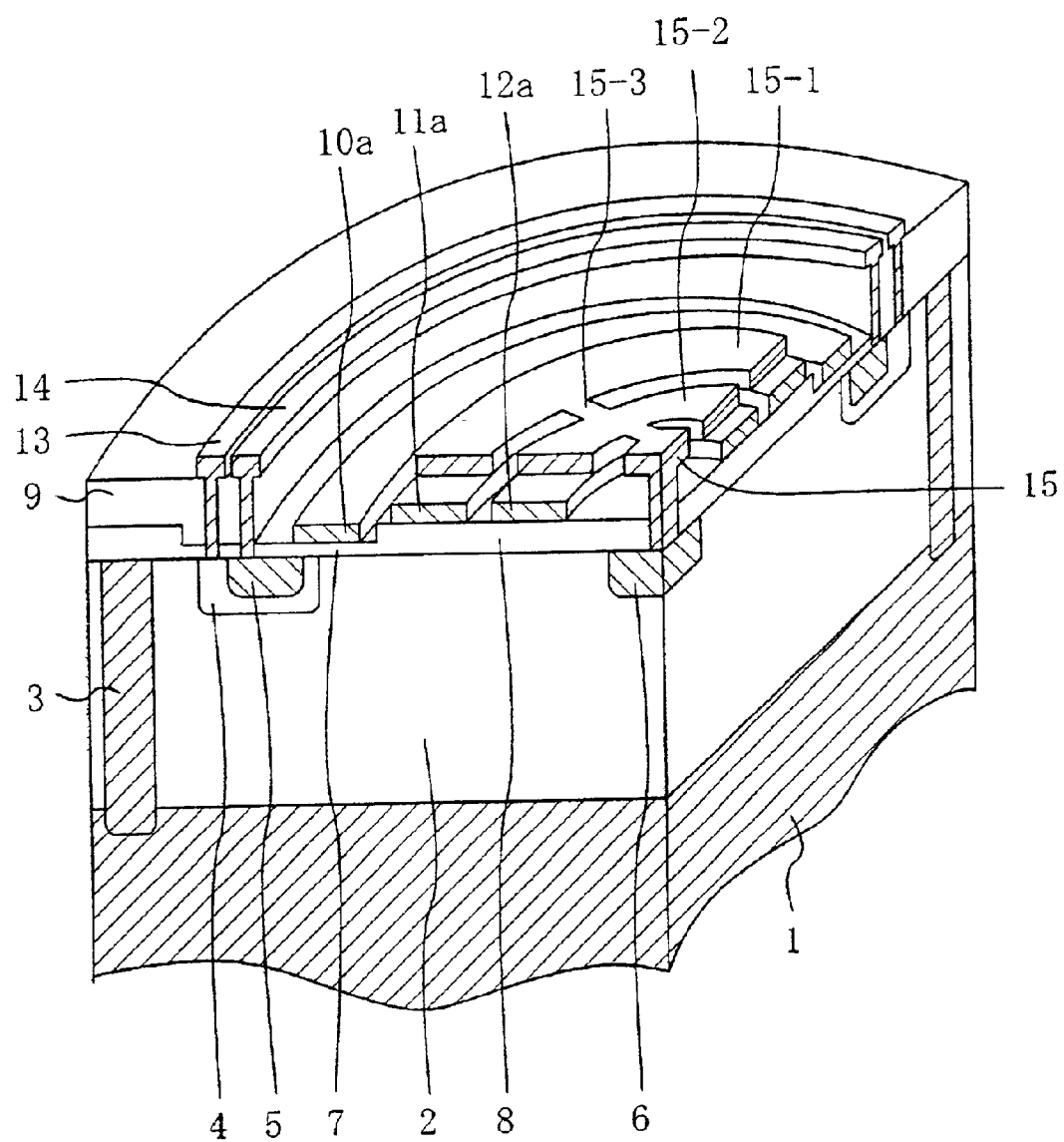
FIG. 1 is a perspective view schematically illustrating a cross-sectional structure for a high-voltage semiconductor device according to a first embodiment of the present invention.

Hereinafter, preferred embodiments of the present invention will be described with reference to the accompanying drawings, in which components with substantially same functions are identified by the same reference numeral for the sake of simplicity. The following description of the present invention will be focused on a semiconductor device with a high breakdown voltage of 100 V or more (e.g., in the range from 500 V to 800 V). It should be noted, however, that the present invention is in no way limited to the following illustrative embodiments.

Embodiment 1

A high-voltage semiconductor device according to a first embodiment of the present invention will be described with reference to FIGS. 1 through 3.

FIG. 1 is a perspective view schematically illustrating a cross-sectional structure for the device of the first embodiment. The device shown in FIG. 1 is formed by a pn junction isolation technique. In FIG. 1, a protective coating, which is the uppermost layer of a semiconductor chip, and a plastic encapsulant, which is used to mold the respective components of the chip together, are not illustrated to make the structure of this embodiment easily understandable. Part of an interlevel dielectric film 9, which actually covers electrodes 10a, 11a and 12a and their surrounding regions, is not illustrated in FIG. 1, either.

As shown in FIG. 1, the device of the first embodiment includes a p-type semiconductor substrate 1. In the substrate, n-type lightly doped semiconductor region 2, p-type doped isolating region 3, p-type doped body region 4 and n-type heavily doped source/drain regions 5 and 6 have been defined. The semiconductor region 2 is defined in the substrate by lightly doping an n-type dopant thereto. The drain region 6 is defined approximately at the center of the semiconductor region 2 by heavily doping an n-type dopant thereto. The body region 4 is defined in the semiconductor region 2 so as to be spaced apart from, and surround, the drain region 6 by doping a p-type dopant thereto. The source region 5 is defined in the body region 4 by heavily doping the n-type dopant thereto. The isolating region 3 is provided to electrically isolate the illustrated part of the semiconductor region 2 from adjacent parts thereof via the pn junctions.

A thin oxide film 7 has been deposited as an exemplary gate insulating film over the body region 4. In the following description, the oxide film 7 will be called a "gate oxide film" for convenience sake. A gate electrode 10a has been formed out of doped polysilicon on the gate oxide film 7. A thick oxide film 8 has been deposited as an exemplary field insulating film over a part of the semiconductor region 2 between the body and drain regions 4 and 6. The oxide film 8 will be herein referred to as a "field oxide film" for the same reason. Multiple (e.g., two in the example illustrated in FIG. 1) plate electrodes 11a and 12a have been formed on the field oxide film 8 so as to be spaced apart from the drain region 6. When the device is viewed from over the substrate, the plate electrodes 11a and 12a surround the drain region 6. The electrodes 11a and 12a are both electrically floating and both made of doped polysilicon. Although not illustrated in FIG. 1, an interlevel dielectric film 9, which may be an oxide film or nitride film, for example, actually covers the oxide films 7 and 8 and electrodes 10a, 11a and 12a.

A body electrode 13, a source electrode 14 and a drain electrode 15 are electrically connected to the body, source and drain regions 4, 5 and 6, respectively. Parts 15-1 and 15-2 of the drain electrode 15 are extended onto the interlevel dielectric film 9 and are located over the plate electrodes 11a and 12a, respectively. Each of the extended parts 15-1 and 15-2 is capacitively coupled to associated one of the plate electrodes 11a and 12a. The extended parts 15-1 and 15-2 are electrically connected to the drain region 6 through a linkage 15-3 and the body of the drain electrode 15. Although not shown in FIG. 1 (see FIG. 2 instead), a protective coating 18 has been deposited on the interlevel dielectric film 9 to cover the metal electrodes 13, 14, 15-1, 15-2 and 15-3. And a plastic encapsulant 19 has been formed on the protective coating 18 to mold the components of the device together.

As shown in FIG. 1, the device of the first embodiment includes the n-type semiconductor region 2 that has been electrically isolated from adjacent devices by surrounding a predetermined part of an n-type semiconductor region in the substrate with the p-type isolating region 3. That is to say, the semiconductor region 2 is an island-like active region isolated from adjacent ones. The n-type drain region 6 has been defined approximately at the center of the semiconductor region 2. The p-type body region 4 is located near and along the isolating region 3 that defines the periphery of the semiconductor region 2. And the n-type heavily doped source region 5 has been defined in the body region 4. Accordingly, the body and source regions 4 and 5 are spaced apart from the drain region 6 and are in the shape of rings surrounding the drain region 6 as viewed from over the substrate.

To increase the breakdown voltage of the device, it is important to avoid an excessive concentration of electric field. For this very purpose, the body and source regions 4 and 5 are ideally in the shape of circular rings as is done in this embodiment. However, these regions 4 and 5 do not have to be circular. For example, these regions 4 and 5 may also be in the shape of polygonal or ellipsoidal rings. In the former case, the corners of the polygon may have obtuse angles. In any case, the breakdown voltage can be almost as high as that obtained by the circular body and source regions 4 and 5.

To attain a sufficiently high breakdown voltage, the planar shape of the drain region 6 should preferably correspond to that of the body region 4. Thus, the drain region 6 is ideally circular as is done in this embodiment However, the drain region 6 does not have to be completely circular but may be approximately circular. For example, the drain region 6 may also be shaped like either a polygon with obtuse corners or an ellipse.

That is to say, the drain region 6 should ideally be circular, and the body and source regions 4 and 5 should ideally be shaped like concentric circles around the drain region 6. However, there will be almost no problem so long as these regions 4, 5 and 6 have at least similar planar shapes. For instance, even if the body region 4 is in the shape of a circular ring and the drain region 6 is polygonal, this combination will make almost no difference, although the breakdown voltage of the device slightly decreases.

The planar shape of the isolating region 3 does not have to correspond to that of the body region 4. For example, even if the body region 4 is in the shape of a circular ring or nearly so, the semiconductor region 2 may be surrounded with an isolating region 3 in a square planar shape.

According to this embodiment, the semiconductor region 2 may be defined either by forming an n-type epitaxial layer on the p-type semiconductor substrate 1 or by selectively defining an n-well in the p-type semiconductor substrate 1. Where the n-well is used as the semiconductor region 2, a counterpart of the p-type isolating region 3 is not always needed. Also, according to this embodiment, the semiconductor region 2 is formed by introducing an n-type dopant at a low doping level. Thus, no n-type heavily doped buried layer is supposed to exist in the interface between the p-type substrate 1 and n-type region 2. Optionally, an n-type heavily doped buried region (not shown) may be locally defined only around the interface under the drain region 6. In that case, a breakdown phenomenon is intentionally caused at the pn junction between the n-type local buried region and p-type substrate 1. Then, a voltage applied to the drain of the insulated-gate transistor can be limited and the breakdown voltage can be increased against static electricity, power surge or surge caused by lightning.

In the foregoing description, when we said "breakdown voltage", that term referred to an initial breakdown voltage of the high-voltage semiconductor device. Hereinafter, it will be described with reference to FIGS. 1 through 3 and results of a life test how the inventive device can maintain its initial breakdown voltage even if the device is supplied with a bias voltage at an elevated temperature.

Figure 2:
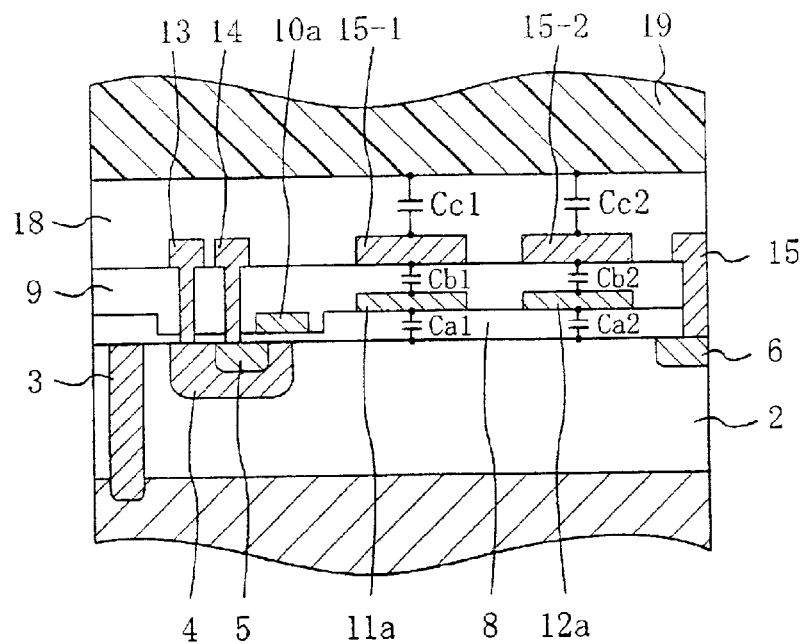
FIG. 2 is a cross-sectional view illustrating a structure for a main part of the device of the first embodiment.
Figure 3:
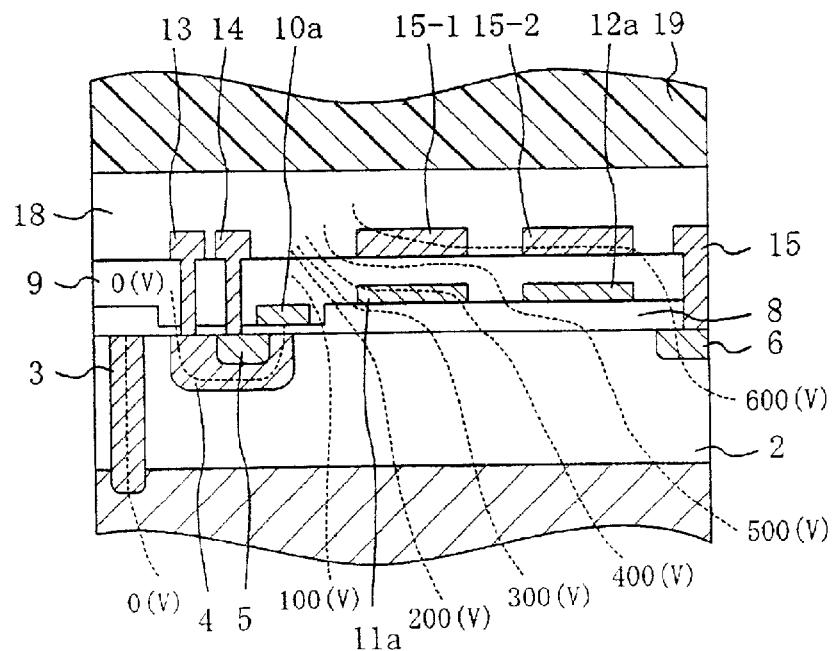
FIG. 3 is a cross-sectional view illustrating potential profiles in the device of the first embodiment.

The device illustrated in FIGS. 1 through 3 has the best structure that can increase the breakdown voltage of the device most efficiently. Specifically, the drain region 6, located at the center of the semiconductor region 2, has a circular planar shape, while the isolating, body and source regions 3, 4 and 5 are in the shape of circular rings that form concentric circles around the drain region 6. The gate oxide film 7, which covers part of the body region 4 closer to the drain region 6, is relatively thin, while the field oxide film 8, which covers part of the semiconductor region 2 closer to the drain region 6, is relatively thick. And the gate electrode 10a has been formed on the gate oxide film 10a. The gate electrode 10a is also formed in the shape of a circular ring just like the body region 4, and is electrically conductive because the electrode 10a is made of doped polysilicon.

The plate electrodes 11a and 12a are formed on the relatively thick field oxide film 8 and are spaced apart from each other. As viewed from over the substrate, these electrodes 11a and 12a are also in the shape of circular rings that form concentric circles around the circular drain region 6. These plate electrodes 11a and 12a are also made of doped polysilicon, and are conductive, too.

The annular metal electrodes (i.e., the extended parts) 15-1 and 15-2 are placed over the plate electrodes 11a and 12a, respectively, with the interlevel dielectric film 9 interposed therebetween. These electrodes 15-1 and 15-2 are electrically connected to the body of the drain electrode 15 via the metal linkage 15-3. The planar shapes of the electrodes 15-1 and 15-2 are preferably the same as, or at least similar to, those of the plate electrodes 11a and 12a located under the electrodes 15-1 and 15-2.

The body, source and drain electrodes 13, 14 and 15 and interlevel dielectric film 9 are all covered with the protective coating 18 to protect the surface of the semiconductor chip. And the protective coating 18 is further covered with the plastic encapsulant 19. The protective coating 18 may be made of silicate glass or polyimide, for example. The plastic encapsulant may be a novolac epoxy resin, for example.

As shown in FIG. 2, a parasitic capacitance Ca1 exists between the plate electrode 11a and semiconductor region 2. A parasitic capacitance Ca2 exists between the plate electrode 12a and semiconductor region 2. A parasitic capacitance Cb1 exists between the plate and metal electrodes 11a and 15-1. A parasitic capacitance Cb2 exists between the plate and metal electrodes 12a and 15-2. A parasitic-capacitance Cc1 exists between the metal electrode 15-1 and plastic encapsulant 19. And a parasitic capacitance Cc2 exists between the metal electrode 15-2 and plastic encapsulant 19. In this case, the same voltage (e.g., 600 V) as that applied to the drain electrode 15 is also applied to the metal electrodes 15-1 and 15-2. Accordingly, the parasitic capacitances Cc1 and Cc2 do not affect the plate electrodes 11a and 12a. Thus, in the following description, the effects of the other parasitic capacitances Ca1, Ca2, Cb1 and Cb2 will be considered.

The potential at the plate electrode 11a is herein supposed to be obtained by dividing a difference between the potential in a part of the semiconductor region 2 under the electrode 11a and the drain voltage of 600 V by a serial circuit consisting of Ca1 and Cb1. The potential at the plate electrode 12a is herein supposed to be obtained by dividing a difference between the potential in a part of the semiconductor region 2 under the electrode 12a and the drain voltage of 600 V by a serial circuit consisting of Ca2 and Cb2.

In the device of this embodiment, in which no n-type heavily doped buried region is provided in the interface between the semiconductor region 2 and substrate 1, the initial breakdown voltage thereof is maintained by utilizing a socalled "re-surf" technique. Hereinafter, its operating principle will be described.

Normally, a ground potential of 0 V is applied to the isolating, body and source regions 3, 4 and 5 and substrate 1, while a drain voltage needed for operating the device is applied to the drain electrode 15. The drain voltage is gradually increased from 0 V. While the drain voltage is still relatively low, a depletion layer, originating from the pn junction between the p-type body region 4 and n-type semiconductor region 2, expands radially from the body region 4 into the semiconductor region 2. Another depletion layer expands laterally from the pn junction between the p-type isolating region 3 and n-type semiconductor region 2. Still another depletion layer expands upward from the pn junction between the n-type semiconductor region 2 and p-type substrate 1. Before long, the latter two depletion layers, expanding laterally from the isolating region 3 and upward from the substrate 1, respectively, are combined with the depletion layer expanding downward from the body region 4. As the drain voltage is further increased, the combined depletion layer starts to expand toward the drain region 6 this time. And when the laterally expanding depletion layer finally reaches an n-type heavily doped region (i.e., the drain region 6 in this case) a breakdown phenomenon occurs. But while the depletion layer is still expanding laterally with the applied voltage increased, the breakdown does not happen. In other words, the breakdown voltage can be kept at its initial value. A technique of maintaining a breakdown voltage for a semiconductor device by laterally expanding the depletion layer from the pn junctions in this manner is called a "re-surf technique" in the art. According to this technique, even if the semiconductor region is relatively thin, the breakdown voltage can be sufficiently high so long as the lateral distance between source/drain regions is relatively long.

The device shown in FIG. 2 has been designed to have a sufficiently high breakdown voltage. Specifically, the distance between the body and drain regions 4 and 6 is long enough to prevent parts of the semiconductor region 2 near the drain region 6 from being depleted even if the voltage of 600 V is applied to the drain electrode 15. In this structure, the potential at a given position in the depletion layer changes depending on how distant from the pn junction the position is. On the other hand, non-depleted regions are at the same potential level. Accordingly, in the structure shown in FIG. 2, part of the semiconductor region 2, which is located under the plate electrode 12a and is closest to the drain region 6, has a potential somewhat lower than the drain voltage, e.g., about 500 V. Another part of the semiconductor region 2, located under the plate electrode 11a and closer to the body region 4 rather than a midpoint between the body and drain regions 4 and 6 is, has a potential lower than half of the drain voltage, e.g., about 240 V.

The potentials at the plate electrodes 11a and 12a can be derived from these potential values. Specifically, the potential at the plate electrode 11a can be obtained by dividing the difference between the potential in that part of the semiconductor region 2 under the plate electrode 11a and the voltage applied to the metal electrode 15-1 by the serial circuit of Ca1 and Cb1. In the illustrated example, the potential at the plate electrode 11a is about 420 V (=(240+600)/2). The potential at the plate electrode 12a can be obtained by dividing the difference between the potential in that part of the semiconductor region 2 under the plate electrode 12a and the voltage applied to the metal electrode 15-2 by the serial circuit of Ca2 and Cb2. In the illustrated example, the potential at the plate electrode 12a is about 550 V (=(500+600)/2).

FIG. 3 schematically illustrates potential profiles that were obtained under the same conditions. Specifically, the potential profiles shown in FIG. 3, which are represented by dashed equipotential lines for 100, 200, 300, 400, 500 and 600 V, were obtained with the voltage of 600 V applied to the drain electrode 15. It should be noted that the potential profiles shown in FIG. 3 and results of simulations carried out by the present inventors showed similar tendencies.

As can be seen from FIG. 3, around the interface between the field oxide film 8 and semiconductor region 2, the oxide film 8 is at a higher potential level than almost all the semiconductor region 2. Accordingly, even if a high-temperature bias test is carried out on this device, no negative mobile charges will be created unlike the prior art example. For that reason, no p-type inversion layer will be formed under the interface. Thus, there is no concern about the decrease in initial breakdown voltage even during the high-temperature bias test.

In this embodiment, the parts 15-1 and 15-2 of the drain electrode 15 are extended onto the interlevel dielectric film 9 and located over the plate electrodes 11a and 12a, respectively, so that the electrodes 11a and 12a are capacitively coupled to the extended parts 15-1 and 15-2. Accordingly, a potential at the electrode 11a or 12a can be obtained by having the potential difference divided by a serial circuit consisting of a parasitic capacitance between the electrode 11a or 12a and extended part 15-1 or 15-2 and a parasitic capacitance between the electrode 11a or 12a and part of the semiconductor region 2 under the electrode 11a or 12a. That is to say, the potential at the electrode 11a or 12a is hardly affected by the protective coating 18 and other upper layers. Thus, a potential higher than that in the semiconductor region 2 can be applied stably to the electrically floating plate electrode 11a or 12a. As a result, even if this device is subjected to the high-temperature bias test, the source-drain breakdown voltage thereof will not decrease.

In the illustrated embodiment, the widths of the plate electrodes 11a and 12a are set equal to those of the metal electrodes 15-1 and 15-2, respectively. In this structure, the serial circuit of Ca1 and Cb1 divides the potential difference almost by two. Thus, the potential difference between the plate electrode 11a and the underlying part of the semiconductor region 2 is about 180 V. As the case may be, the potential difference might be so great that the electric field could be concentrated excessively around the end of the plate electrode 11a closer to the gate electrode 10a. In that case, the initial breakdown voltage could not be sufficient high. To avoid this unwanted phenomenon by reducing the potential difference between the plate electrode and semiconductor region, the device of the first embodiment is modifiable as will be described next for the second embodiment of the present invention.

Embodiment 2

Hereinafter, a high-voltage semiconductor device according to the second embodiment will be described with reference to FIG. 4.

Figure 4:
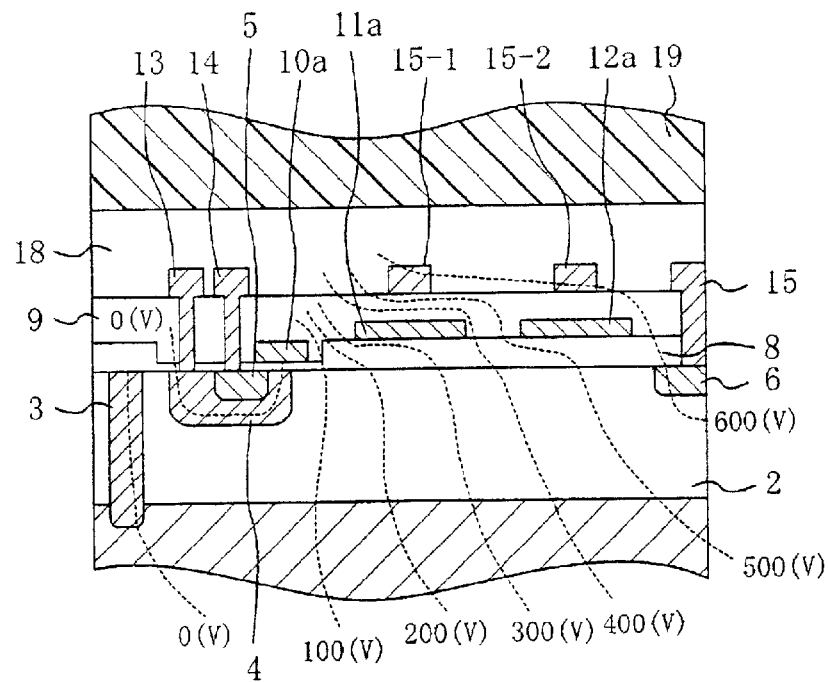
FIG. 4 is a cross-sectional view illustrating a structure for a main part of a high-voltage semiconductor device according to a second embodiment of the present invention.

FIG. 4 schematically illustrates a cross-sectional structure for the device of the second embodiment. In the second embodiment, the widths of the metal electrodes 15-1 and 15-2 are half of the widths of the plate electrodes 11a and 12a. Suppose the operating conditions for the device of the second embodiment are the same as the device of the first embodiment. Then, the potential difference (about 120 V) between the electrode 11a and semiconductor region 2 can be obtained by dividing the difference between the potential (about 240 V) in part of the semiconductor region 2 under the electrode 11a and the voltage (about 600 V) applied to the electrode 15-1 by the serial circuit Ca1+Cb1. Thus, the potential at the electrode 11a is about 360 V. The potential at the electrode 12a can be obtained by dividing the difference between the potential (about 500 V) in part of the semiconductor region 2 under the electrode 12a and the voltage (about 600 V) applied to the electrode 15-2 by the serial circuit Ca2+Cb2. Thus, the potential at the electrode 12a is about 530 V.

FIG. 4 schematically illustrates potential profiles that were obtained under the same conditions. The profiles shown in FIG. 4 are represented by dashed equipotential lines. It should be noted that the potential profiles shown in FIG. 4 and results of simulations carried out by the present inventors showed similar tendencies.

As can be seen from FIG. 4, around the interface between the field oxide film 8 and semiconductor region 2, the oxide film 8 is at a higher potential level than almost all the semiconductor region 2. Accordingly, even if the high-temperature bias test is carried out on this device, no p-type inversion layer will be formed under the interface. Thus, there is no concern about the decrease in initial breakdown voltage of the device. We also found that the electric field was not concentrated around the end of the electrode 11a, closer to the gate electrode 10a, so much in the second embodiment as the first embodiment where the electrodes 15-1 and 15-2 are as wide as the electrodes 11a and 12a. This effect was attained because the widths of the annular metal electrodes 15-1 and 15-2 were halved in the second embodiment. Specifically, an initial breakdown voltage of 700 V, which is higher than that of the first embodiment by about 200 V, could be obtained according to the second embodiment.

In the second embodiment, the coupling capacitance between the plate electrode 11a or 12a and semiconductor region 2 can be greater than the coupling capacitance between the electrode 11a or 12a and annular metal electrode 15-1 or 15-2. Thus, the potential difference between the electrode 11a or 12a and the underlying part of the semiconductor region 2 can be reduced compared to the first embodiment. As a result, the electric field is not concentrated so much around the body region and the initial breakdown voltage of the device can be kept sufficiently high. Furthermore, the breakdown voltage does not decrease even during the high-temperature bias test.

Following is the conditions adopted for the experiments we carried out for the first and second embodiments. The p-type semiconductor substrate 1 had a resistivity of 50 Ω·cm. The n-type semiconductor region 2 had a resistivity of 5 Ω·m and a thickness of 15 μm. The field oxide film 8 was 2 μm thick. The interlevel dielectric film 9 had a two-layer structure consisting of a CVD film with a thickness of 1.2 μm and a CVD film containing 8.5 wt % of phosphorus and having a thickness of 1.8 μm. The protective coating 18 also had a two-layer structure consisting of a CVD film containing 4.0 wt % of phosphorus and having a thickness of 0.5 μm and a nitride film with a thickness of 1.0 μm.

When we carried out a high-temperature bias test under these conditions, good test results could be obtained. That is to say, the source-drain breakdown voltage of the device hardly decreased.

In the second embodiment, the annular metal electrodes 15-1 and 15-2 are half as wide as the underlying plate electrodes 11a and 12a. However, if the semiconductor device should have a relatively low breakdown voltage (e.g., about 500 V), then the metal electrodes 15-1 and 15-2 may be relatively wide (e.g., about ⅔ as wide as the plate electrodes 11a and 12a). Conversely, if the breakdown voltage should be relatively high, then the metal electrodes 15-1 and 15-2 may be relatively narrow (e.g., about ¼ as wide as the plate electrodes 11a and 12a).

It should be noted that the structure of the second embodiment is effective on the supposition that the protective coating 18 always ensures good insulation in any situation. In that case, there is no problem even if each of the metal electrodes 15-1 and 15-2 is half as wide as the plate electrode 11a or 12a. In this structure, however, if the protective coating 18 has lost its insulation properties partially due to some defects created, then the plate electrode 12a at the higher potential level will likely be affected by the loss. To avoid this unfavorable phenomenon, the device of the first embodiment may be modified as will be described next for the third embodiment of the present invention.

Embodiment 3

Hereinafter, a high-voltage semiconductor device according to the third embodiment will be described with reference to FIG. 5.

Figure 5:
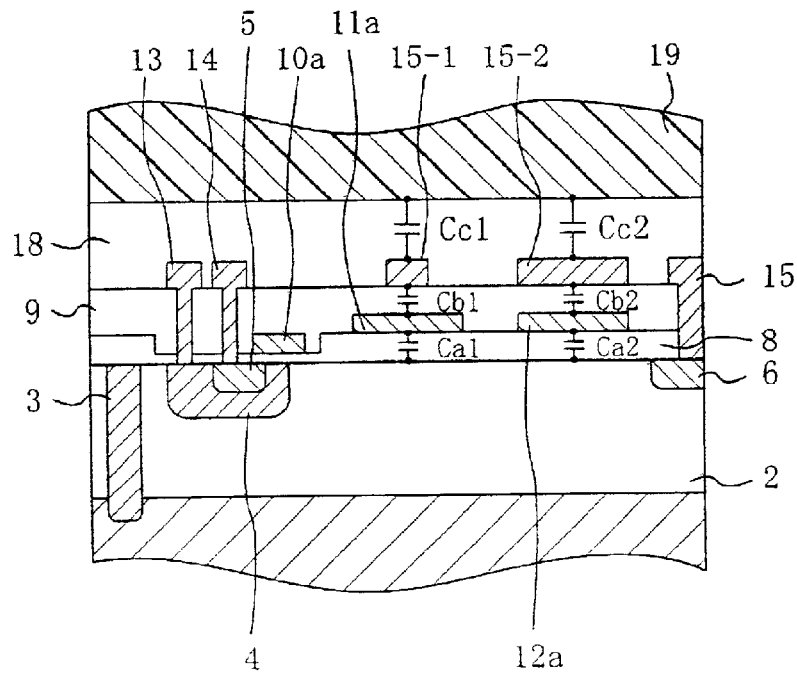
FIG. 5 is a cross-sectional view illustrating a structure for a main part of a high-voltage semiconductor device according to a third embodiment of the present invention.

FIG. 5 schematically illustrates a cross-sectional structure for a main part of the device of the third embodiment. In this embodiment, a ratio of coupling capacitance between the electrodes 11a and 15-1 to that between the electrode 11a and semiconductor region 2 is different from a ratio of coupling capacitance between the electrodes 12a and 15-2 to that between the electrode 12a and region 2. In such a structure, the plate electrode 12a at the higher potential level is not affected so much even if the protective coating 18 has partially lost its insulation properties.

In the structure shown in FIG. 5, the annular metal electrode 15-1 is half as wide as the plate electrode 11a, while the other annular metal electrode 15-2 is wider than the plate electrode 12a. In other words, the metal electrode 15-2 is wide enough to overlap the entire upper surface of the plate electrode 12a, which is located closest to the drain region 6, with the interlevel dielectric film 9 interposed therebetween. In the other respects, the device of the third embodiment is the same as the counterparts of the first and second embodiments and the description thereof will be omitted herein.

Even when the metal electrode 15-2 is made wider than the underlying plate electrode 12a as is done in this embodiment, the parasitic capacitance Cb2 formed between the plate and metal electrodes 12a and 15-2 is substantially the same. Thus, almost the same effects as those of the foregoing embodiments are attainable.

Figure 6:
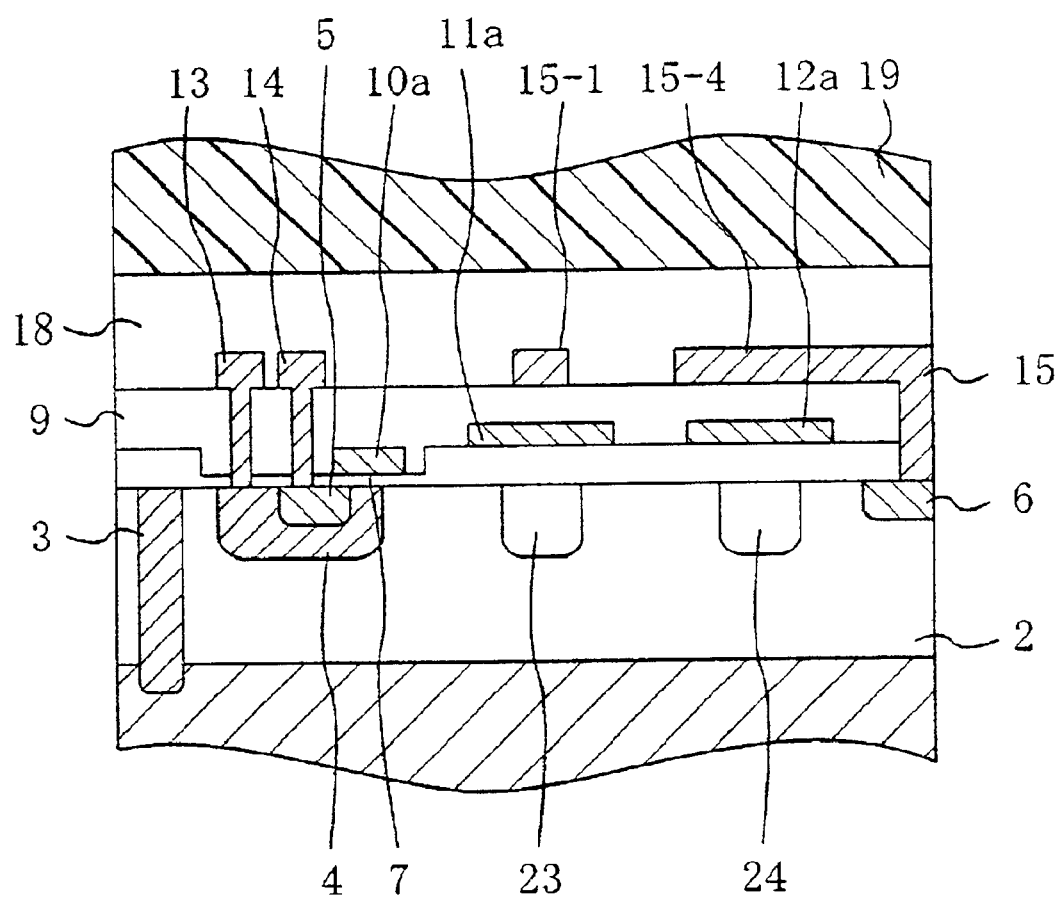
FIG. 6 is a cross-sectional view illustrating a structure for a main part of a high-voltage semiconductor device according to a modified example of the third embodiment.

The same effects are also attainable even if a metal electrode 15-4 in a disk-like planar shape is formed as shown in FIG. 6 by further widening the metal electrode 15-2 shown in FIG. 5 and combining the electrode 15-2 with the drain electrode 15. FIG. 6 illustrates a modified example for the structure shown in FIG. 5. The device shown in FIG. 6 is the same as the counterpart shown in FIG. 5 except that the former device includes the disk-like metal electrode 15-4 and p-type girdling regions 23 and 24, which will be described in detail later. Optionally, the p-type girdling regions 23 and 24 may be omitted from the device shown in FIG. 6.

In the structure shown in FIG. 6, the metal electrode 15-4 entirely covers the upper surface of the electrically floating plate electrode 12a. Accordingly, even if the protective coating 18 has partially lost its insulation properties due to defects created, the adverse effects of the poor insulation are blocked by the metal electrode 15-4. This is because the drain voltage is applied from the drain electrode to the metal electrode 15-4. As a result, the plate electrode 12a and semiconductor region 2 under the metal electrode 15-4 are not affected.

The electrically floating plate electrode 11a, located closer to the body region 4, has its potential determined by the serial circuit consisting of the parasitic capacitance Ca1 between the electrode 11a and semiconductor region 2 and the parasitic capacitance Cb1 between the electrodes 11a and 15-1. Since the metal electrode 15-1 is half as wide as the plate electrode 11a, Ca1/Cb1 is about two. Accordingly, the potential at the plate electrode 11a is set slightly higher than the potential at the underlying part of the semiconductor region 2. For that reason, no p-type inversion layer will be formed under the surface of the semiconductor region 2. And the breakdown voltage of the device will not decrease even if the device is subjected to a life test like a high-temperature bias test. In addition, the surface potential of the semiconductor region 2 can be decreased gradually by the metal electrodes 15-1 and 15-2 (or 15-4). As a result, excessive concentration of electric field is avoidable and the initial breakdown voltage can be kept high.

Even if defects have been created in the protective coating 18, the potential at the annular metal electrode 15-1 can be kept equal to the drain voltage because the electrode 15-1 is connected to the drain electrode 15. That is to say, the potential at the electrode 15-1 is not affected by the insufficient insulation. Also, if regions surrounding the metal electrode 15-1 have become electrically conductive due to the loss of the insulation properties, then those conductive regions are at a potential level equal to the drain voltage. As a result, the parasitic capacitance Cb1 increases correspondingly and the potential at the plate electrode 11a becomes reatively high. That is to say, even if the protective coating 18, which is easily affected by a stress, has partially lost its insulation properties, a highly reliable high-voltage semiconductor device is still realized so long as the loss is not significant.

In the foregoing embodiments illustrated in FIGS. 1 through 6, two electrically floating plate electrodes 11a and 12a are used. However, the number of plate electrodes is not limited to two according to the present invention. If necessary, three, four or more plate electrodes may be provided and the same number of annular metal electrodes may be formed over the plate electrodes. In that case, the more distant from the drain region 6 each of those metal electrodes is, the narrower the width of the electrode should be. Then, the concentration of electric field can be further reduced, the initial breakdown voltage can be kept high and the device is even less affected by the insufficient insulation of the protective coating. That is to say, in such a structure, the more distant from the drain region 6 each plate electrode is, the greater the coupling capacitance (i.e., the smaller the potential difference) between the plate electrode and semiconductor region 2. Thus, the electric field concentration can be reduced over the entire semiconductor region and the initial breakdown voltage can be kept high on top of that, the breakdown voltage does not decrease even during a high-temperature bias test.

Figure 7:
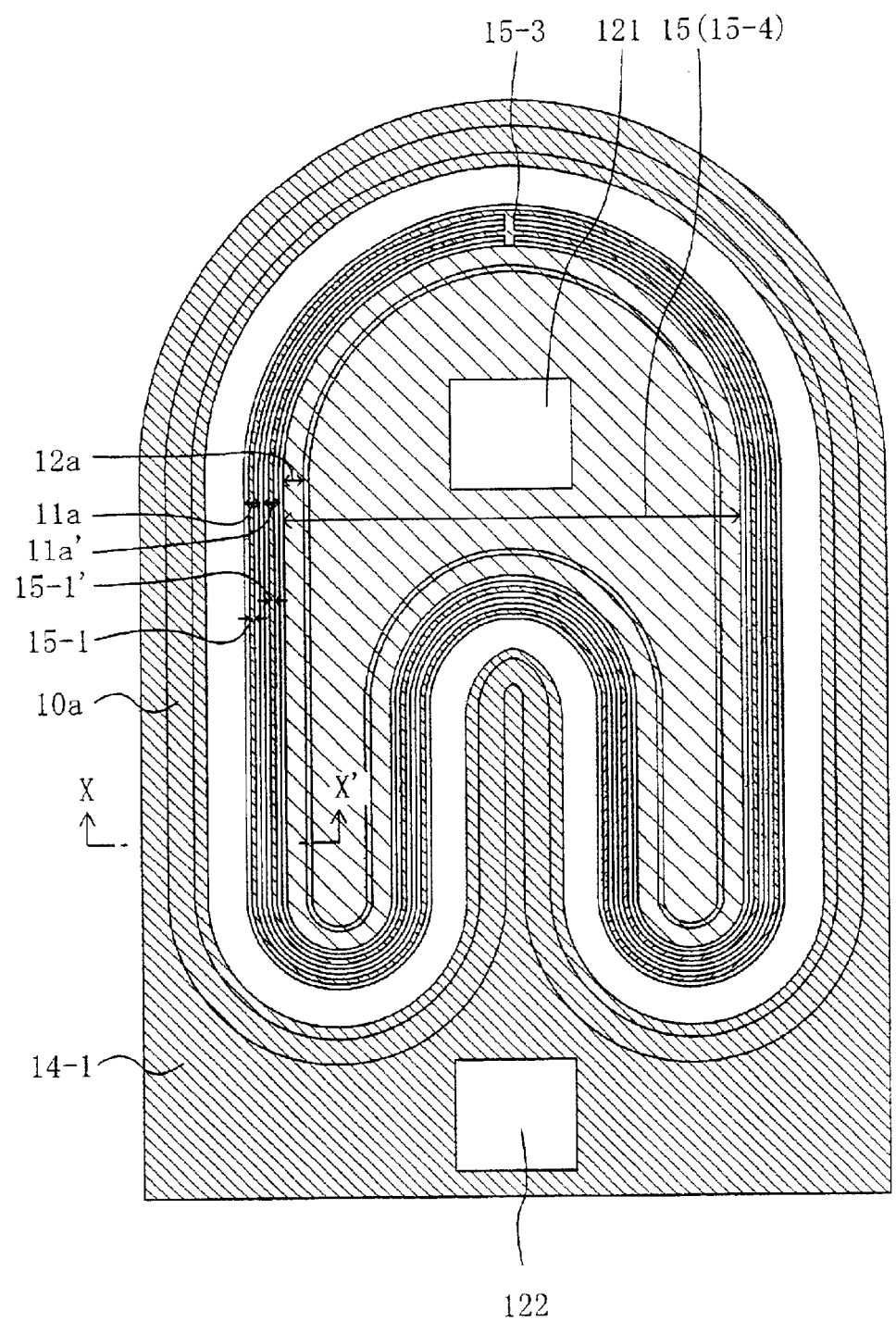
FIG. 7 is a plan view illustrating a layout for the device shown in FIG. 6.

FIG. 7 schematically illustrates a planar layout according to a modified example for the structure shown in FIG. 6. A cross-sectional structure (not shown) of the device taken along the line X-X' shown in FIG. 7 (i.e., a cross-sectional structure between the source/drain regions) further includes: another plate electrode 11a' between the electrodes 11a and 12a shown in FIG. 6; and another annular metal electrode 15-1' over the plate electrode 11a'. Also, in this modified example, a source/body common electrode 14-1 is formed by combining the source and body electrodes 14 and 13 together. In the other respects, the device shown in FIG. 7 is the same as the device shown in FIG. 6. In FIG. 7, only the metal and plate electrodes are illustrated to make the structure easily understandable.

As shown in FIG. 7, bonding pads 121 and 122 are provided for the drain electrode 15 and source/body common electrode 14-1, respectively. Each of these bonding pads 121 and 122 is formed by removing parts of the protective coating 18, which are located over the region to be the pad 121 or 122, so that the region is exposed.

In the structure shown in FIG. 7, each of the source/drain regions is formed in a finger shape to increase the gate width per unit area. Alternatively, the source or drain region may be formed in the shape of a comb with multiple fingers. When the source or drain region is shaped like a finger (or a comb), the gate width per unit area can be increased. Accordingly, the device with such a structure can be used even at a large current on the orders of several hundreds mA to several tens A. Furthermore, a high-voltage power transistor, which does not have its breakdown voltage decreased even at a high-temperature bias test, is realized.

Figure 8:
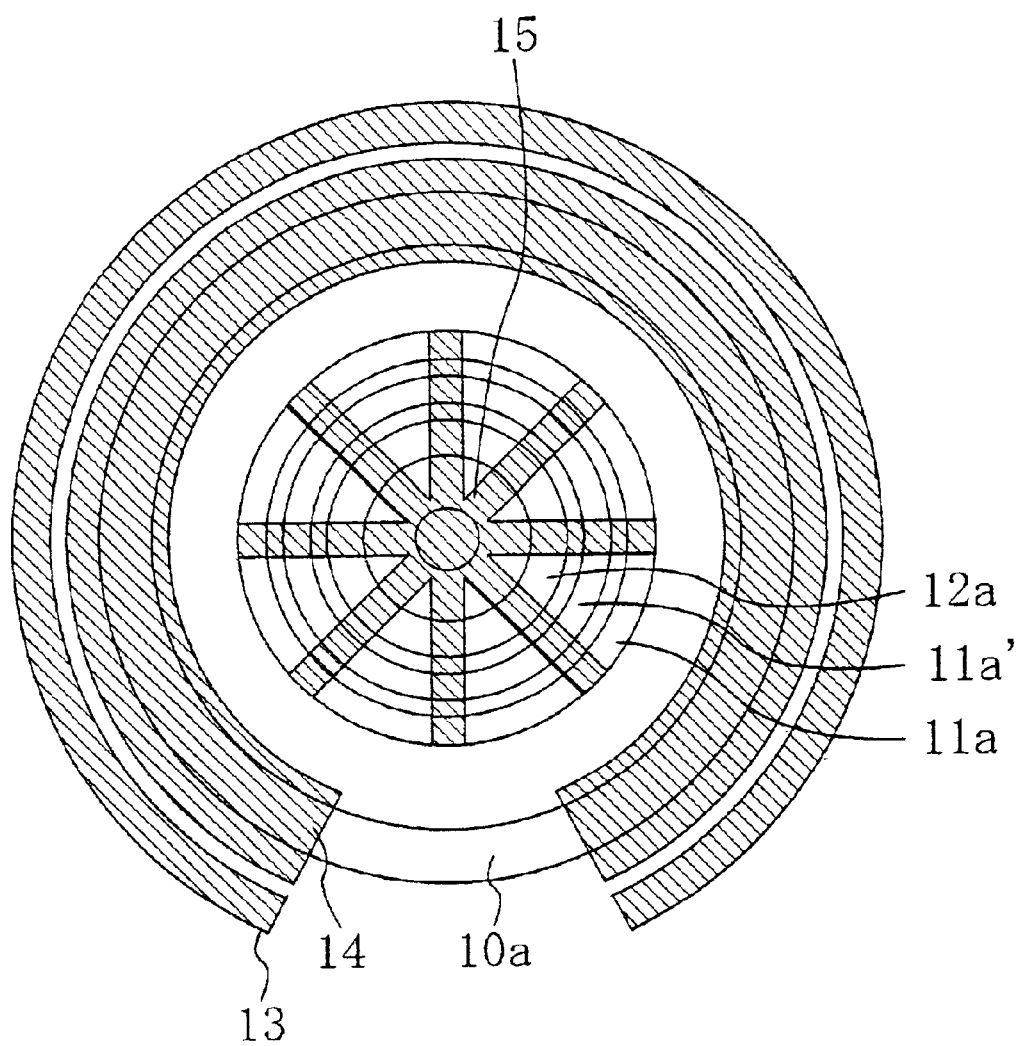
FIG. 8 is a plan view illustrating a layout for a high-voltage semiconductor device according to another modified example of the third embodiment.
Figure 9:
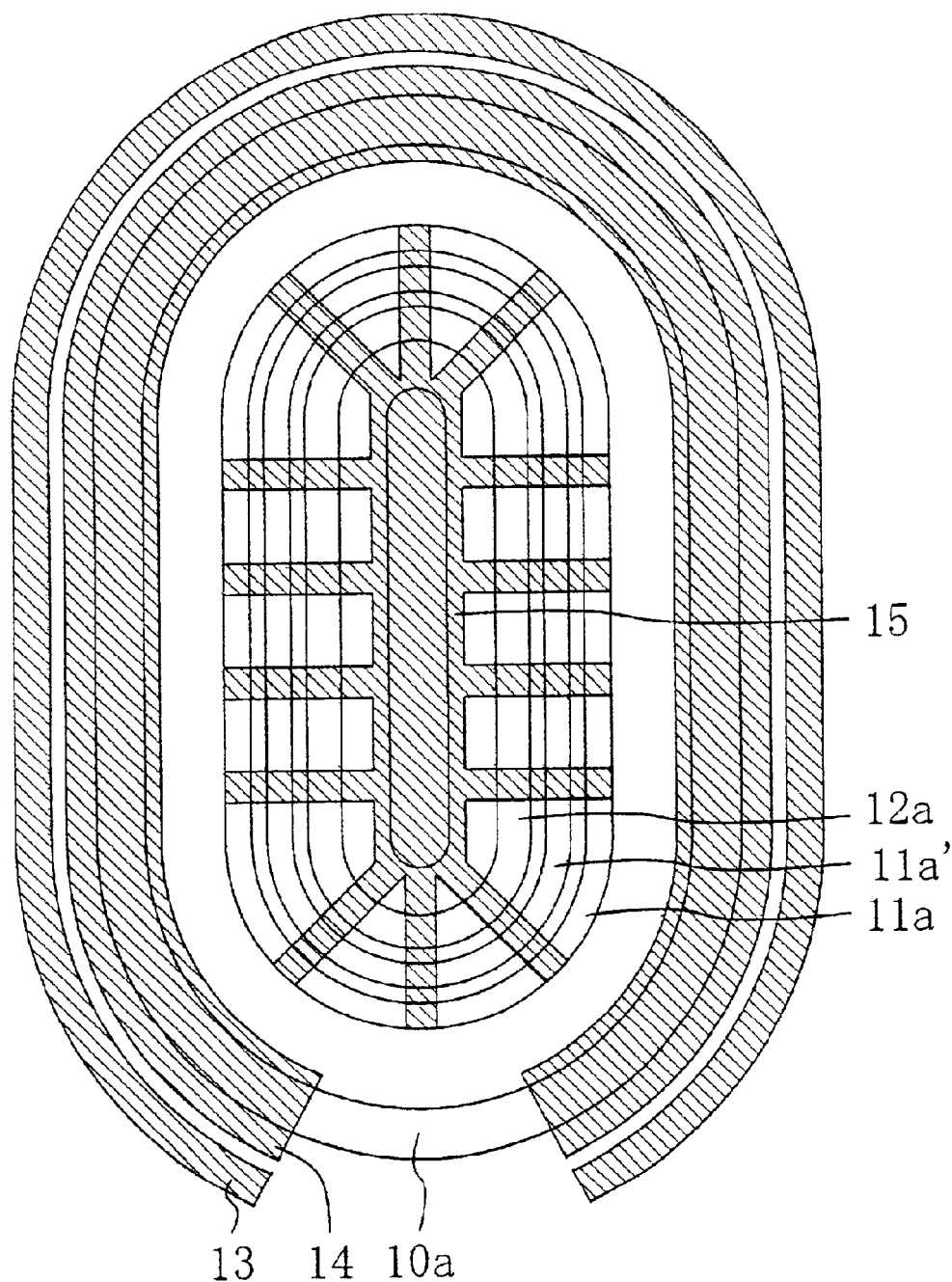
FIG. 9 is a plan view illustrating a layout for a high-voltage semiconductor device according to still another modified example of the third embodiment.

The device may be modified in any other way. In the foregoing embodiments, part (e.g., 15-1) of the metal electrode 15 is formed in the shape of a circular ring. Alternatively, as shown in FIG. 8, parts of the metal electrode 15 may be extended radially as viewed from over the substrate. That is to say, parts of the metal electrode 15 may cross the plate electrodes 11a, 11a, and 12a. Even in such a structure, the creation of negative mobile charges is still avoidable at the time of a high-temperature bias test and the decrease in initial breakdown voltage is also suppressible as in the foregoing embodiments. The electrodes 13, 14 and 15 do not have to be circular as shown in FIG. 8, but may be approximately ellipsoidal (or in the shape of tracks) as shown in FIG. 9.

Embodiment 4

Hereinafter, a high-voltage semiconductor device according to a fourth embodiment of the present invention will be described with reference to FIG. 10.

Figure 10:
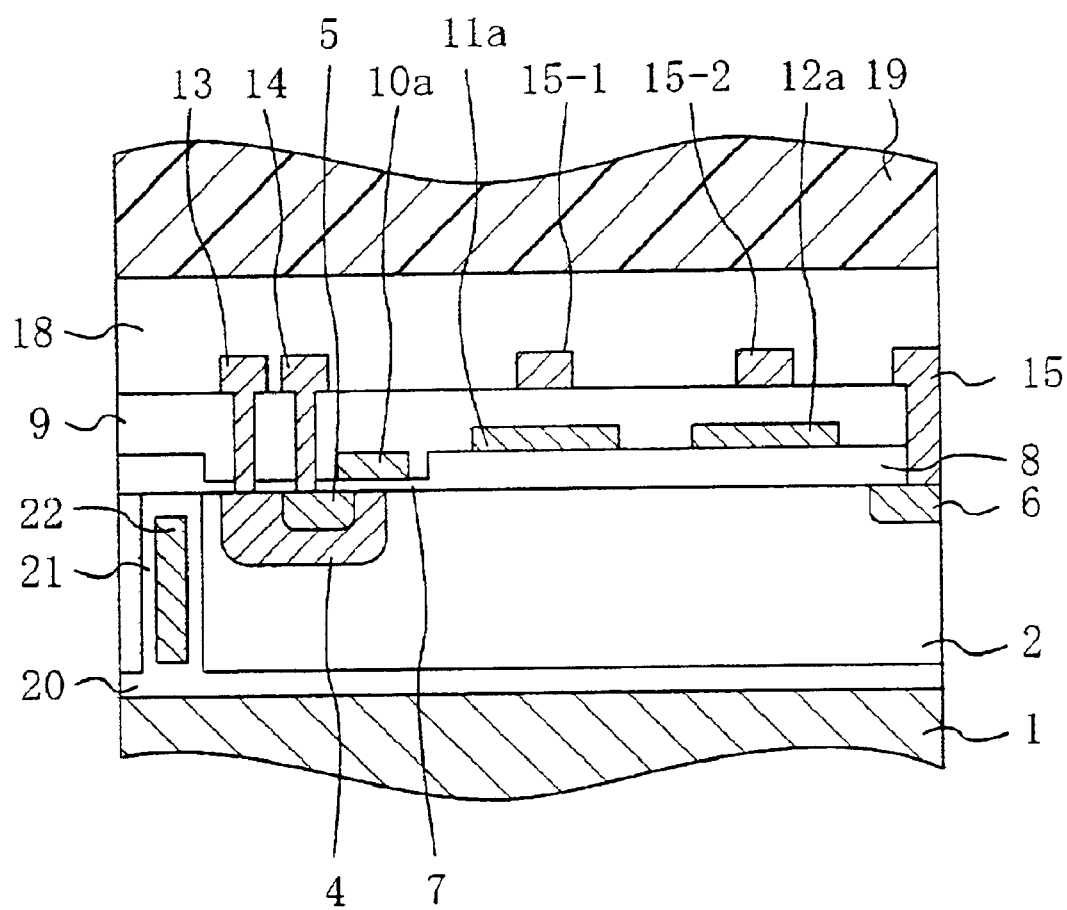
FIG. 10 is a cross-sectional view illustrating a structure for a main part of a high-voltage semiconductor device according to a fourth embodiment of the present invention.

FIG. 10 schematically illustrates a cross-sectional structure for a main part of the device of the fourth embodiment. Unlike the devices of the foregoing embodiments with the pn junction isolation structure, the device of the fourth embodiment has a dielectric isolation structure. Similar features will not be described for the sake of simplicity.

The device of the fourth embodiment has a structure in which the semiconductor region 2 is entirely surrounded with an insulator by a dielectric isolation technique. Specifically, as shown in FIG. 10, a bonding oxide film 20 is formed on the p-type semiconductor substrate 1 and the semiconductor region 2 is defined on the oxide film 20. A trench is formed around the semiconductor region 2. And the trench is filled in with an isolation oxide film 21 and a polysilicon layer 22.

Next, it will be described how the device with this structure operates. Normally, the device is operated with a ground potential applied to the body and source electrodes 13 and 14 and substrate 1, a positive voltage applied to the drain electrode 15 and a control voltage of about 10 V applied to the gate electrode 10a. Accordingly, when the breakdown voltage of the device is measured with a high voltage between 500 and 800 V applied to the drain electrode 15, the potential at the gate electrode 10a may be regarded as substantially equal to the ground potential.

In the structure shown in FIG. 10, as the drain voltage is gradually increased, a depletion layer, originating from the pn junction between the p-type body region 4 and n-type semiconductor region 2, expands both laterally and downward from the body region 4. Once the expanding depletion layer has reached the bonding oxide film 20, the depletion layer starts to expand laterally toward the drain region 6. While the depletion layer is expanding inconstantly depending on the drain voltage, the breakdown voltage of the device can be kept at its initial value. And when the depletion layer reaches an n-type heavily doped region like the drain region 6, a breakdown phenomenon occurs.

As can be seen, the re-surf technique for the first embodiment is also applicable to the device of the fourth embodiment, although the semiconductor region 2 is isolated differently from the first embodiment. The structure on the semiconductor region 2 may also be formed as in the second or third embodiment. Then, the reliability of the device about the breakdown voltage (particularly at a life test in which a bias voltage is applied at a high temperature) can be further improved. When the dielectric isolation structure of this embodiment is adopted, the parasitic capacitance between the semiconductor region 2 and substrate 1 can be extremely small. As a result, the resultant semiconductor device can advantageously operate at a very high frequency or switch at a very high speed and yet has a sufficiently high breakdown voltage.

Embodiment 5

Hereinafter, a high-voltage semiconductor device according to a fifth embodiment of the present invention will be described with reference to FIG. 11.

Figure 11:
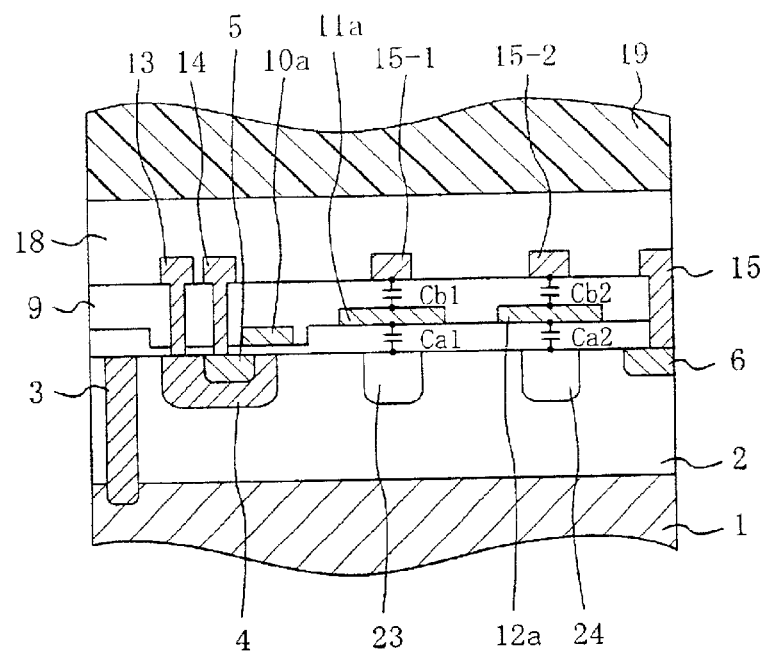
FIG. 11 is a cross-sectional view illustrating a structure for a main part of a high-voltage semiconductor device according to a fifth embodiment of the present invention.

FIG. 11 schematically illustrates a cross-sectional structure for a main part of the device of the fifth embodiment. The device of the fifth embodiment includes the girdling regions 23 and 24, which are defined in respective parts of the semiconductor region 2 under the plate electrodes 11a and 12a, in addition to all components of the second embodiment shown in FIG. 4. In the other respects, the device of the fifth embodiment is the same as the device of the second embodiment. Thus, the description thereof will be omitted herein.

In this embodiment, the girdling regions 23 and 24 are defined in respective parts of the semiconductor region 2 between the body and drain regions 4 and 6 by diffusing a p-type dopant thereto. Specifically, the p-type girdling regions 23 and 24 are located under the plate electrodes 11a and 12a, respectively. These girdling regions 23 and 24 may be shaped in circular rings, which form concentric circles around the drain region 6, as viewed from over the substrate.

Where the girdling regions 23 and 24 are provided between the body and drain regions 4 and 6, a depletion layer, expanding laterally from the pn junction between the body and semiconductor regions 4 and 2, is combined with depletion layers expanding downward from the regions 23 and 24. Thus, the curvature of the combined depletion layer increases. As a result, the electric field concentration can be reduced and the initial breakdown voltage can be increased considerably.

In this embodiment, the plate electrode 11a or 12a has its potential determined by the serial circuit consisting of the parasitic capacitance Cb1 or Cb2 between the electrode 11a or 12a and drain electrode 15 and the parasitic capacitance Ca1 or Ca2 between the electrode 11a or 12a and girdling region 23 or 24. Accordingly, the potential at the plate electrode 11a or 12a can be higher than the surface potential of the girdling region 23 or 24 or that of the semiconductor region 2. For that reason, the potential at the oxide film 8 can be higher than the surface potential of the semiconductor region 2. And no p-type inversion layer will be formed under the surface of the n-type semiconductor region 2 even at the time of a high-temperature bias test. As a result, the source-drain breakdown voltage of the device hardly decreases.

Figure 12:
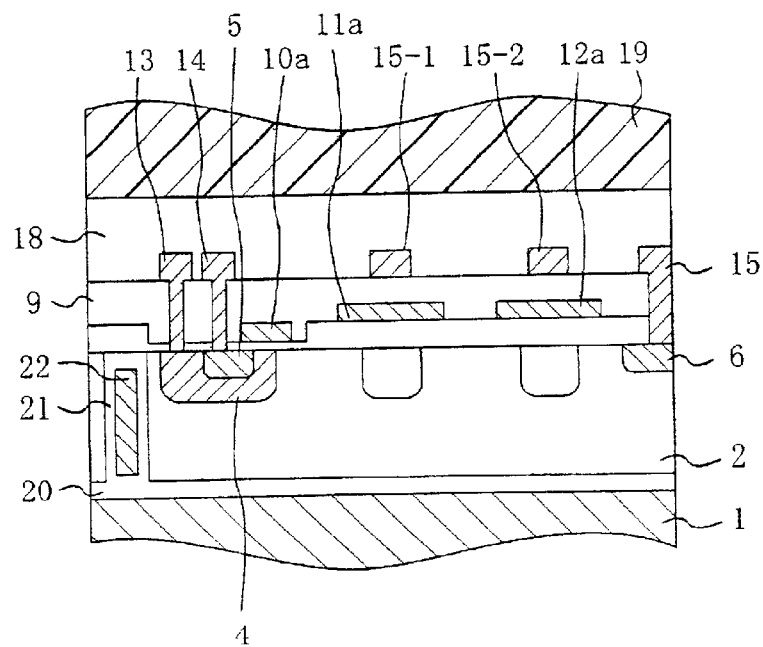
FIG. 12 is a cross-sectional view illustrating a structure for a main part of a high-voltage semiconductor device according to a modified example of the fifth embodiment.

The structure shown in FIG. 11 may be modified in the following manner. FIG. 12 illustrates a modified example for the structure shown in FIG. 11. The device of this modified example has a structure in which the semiconductor region 2 is entirely surrounded with an insulator by a dielectric isolation technique. Specifically, as shown in FIG. 12, the device includes an SOI substrate, in which the bonding oxide film 20 is formed on the p-type semiconductor substrate 1 and the n-type semiconductor region 2 is defined on the oxide film 20. A trench is formed in the SOI substrate and filled in with the isolation oxide film 21 and polysilicon layer 22. The device shown in FIG. 12 is basically the same as the device shown in FIG. 11 except that the semiconductor region 2 is isolated with a dielectric. Thus, similar features will not be described herein.

As described for the fourth embodiment, the re-surf technique for the pn junction isolation structure is also applicable to the dielectric isolation structure. The breakdown voltage of the device shown in FIG. 12 is almost equal to that of the device shown in FIG. 11. Accordingly, by utilizing the dielectric isolation structure, a semiconductor device that has a high breakdown voltage and yet can operate at a high frequency is realized.

Figure 13:
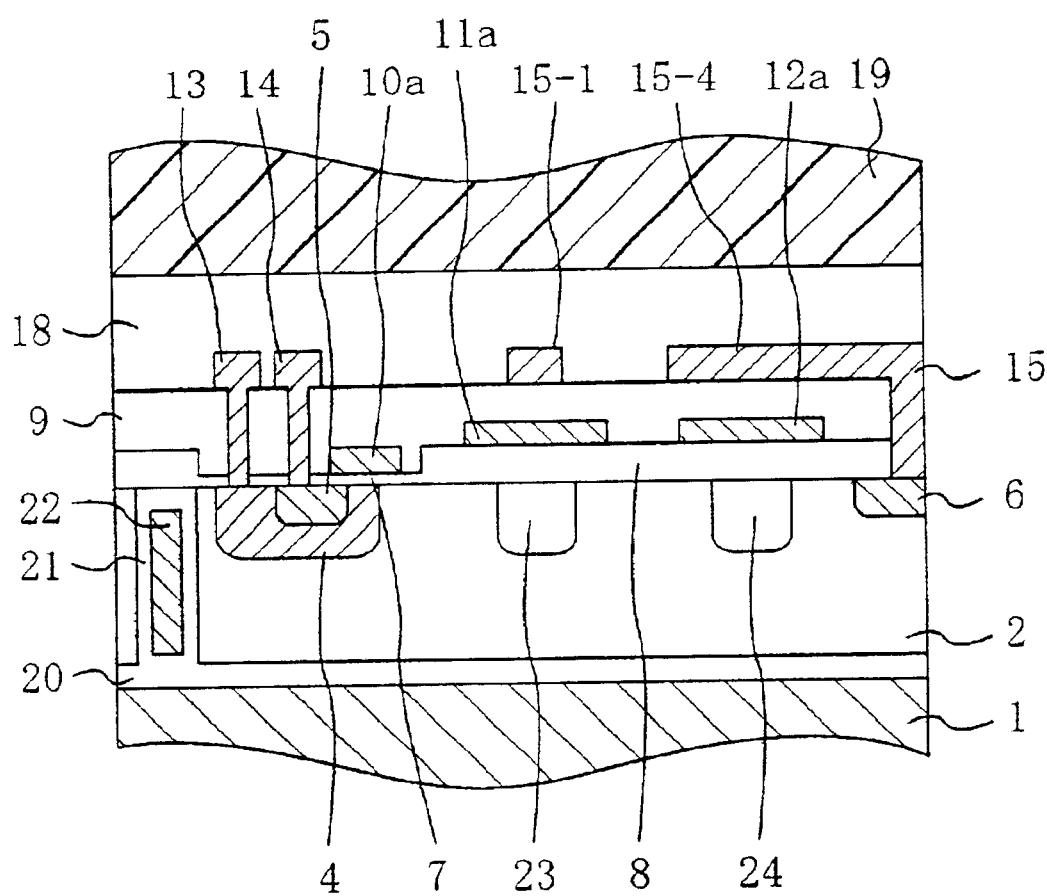
FIG. 13 is a cross-sectional view illustrating a structure for a main part of a high-voltage semiconductor device according to another modified example of the fifth embodiment.
Figure 14:
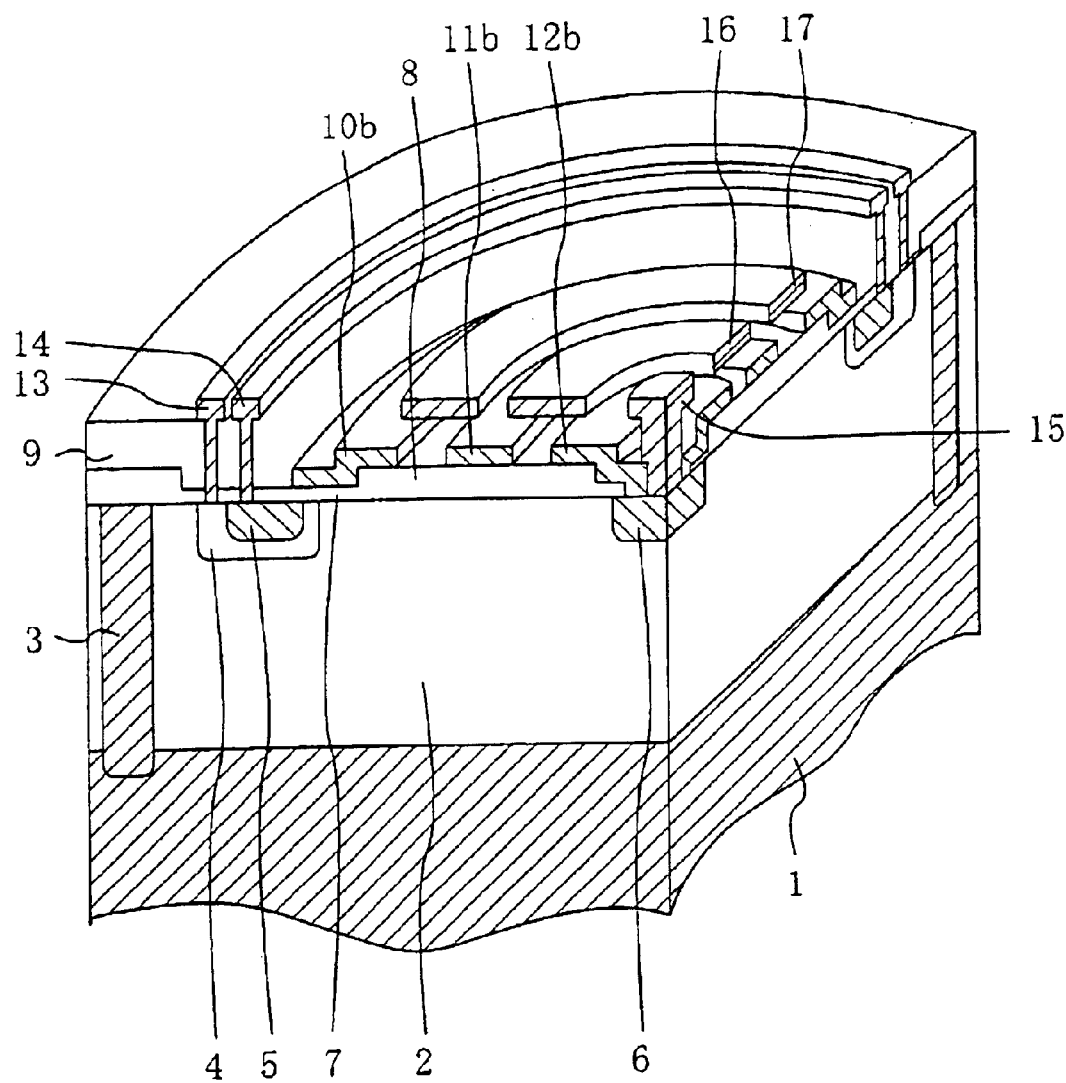
FIG. 14 is a perspective view schematically illustrating a cross-sectional structure for a high-voltage semiconductor device according to a first prior art example.
Figure 15:
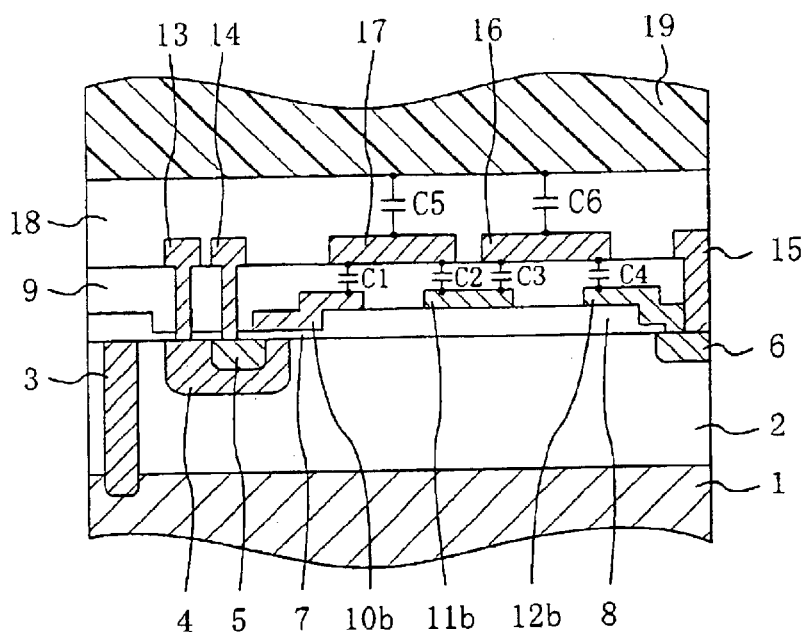
FIG. 15 is a cross-sectional view illustrating a structure for a main part of the device of the first prior art example.
Figure 16:
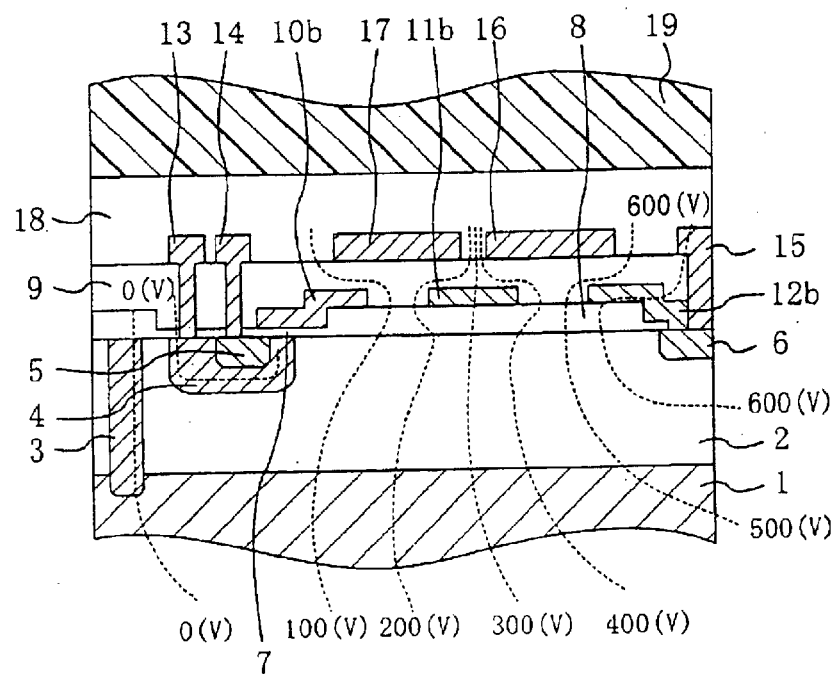
FIG. 16 is a cross-sectional view illustrating potential profiles at room temperature in the device of the first prior art example.
Figure 17:
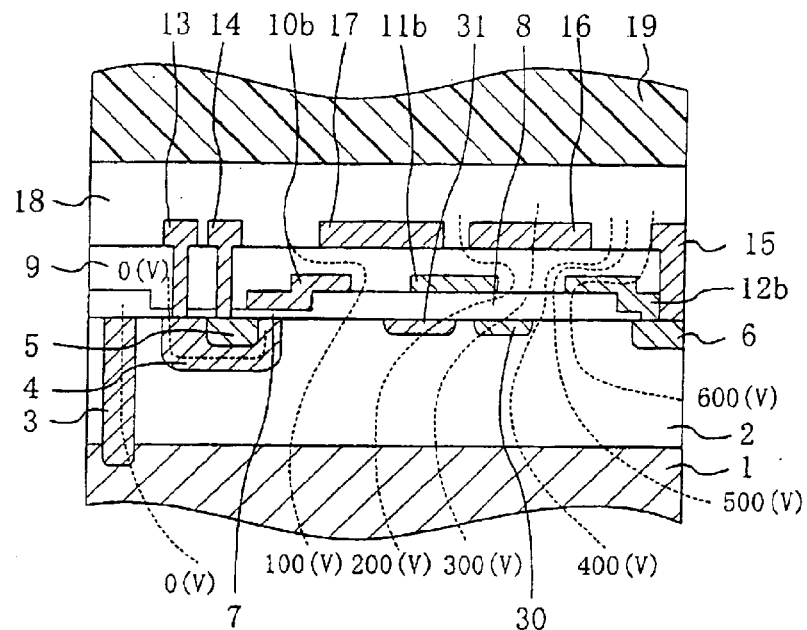
FIG. 17 is a cross-sectional view illustrating how the breakdown voltage of the device of the first prior art example decreases during a high-temperature bias test.
Figure 18:
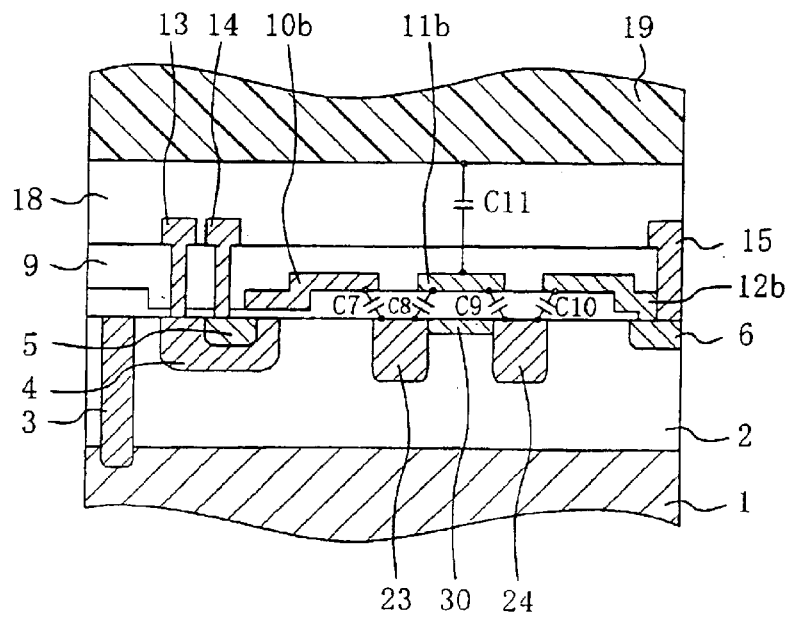
FIG. 18 is a cross-sectional view illustrating how the breakdown voltage of a high-voltage semiconductor device according to a second prior art example decreases.

Furthermore, the structure shown in FIG. 12 may be modified as shown in FIG. 13. In the structure shown in FIG. 13, the metal electrode 15-2 closest to the drain region 6 in the structure shown in FIG. 12 is combined with the drain electrode 15 to obtain a disk-like metal electrode 15-4.

In the structure shown in FIG. 13, the disk-like metal electrode 15-4 entirely covers the upper surface of the plate electrode 12a closest to the drain region 6. And the potential at the plate electrode 12a can be approximately equalized with the drain voltage. Thus, even if the protective coating 18 has partially lost its insulation properties, the underlying layers are not affected. In addition, the width of the annular metal electrode 15-1, located over the plate electrode 11a closer to the body region 4, is half of the width of the plate electrode 11a. Accordingly, the coupling capacitance formed between the plate electrode 11a and part of the semiconductor region 2 under the electrode 11a can be increased. As a result, the potential difference between the plate electrode 11a and that part of the semiconductor region 2 is not so large, the electric field concentration can be reduced and the initial breakdown voltage can be increased. Furthermore, even if the protective coating 18 has partially lost its insulation properties to make regions surrounding the metal electrode 15-1 electrically conductive, the parasitic capacitance just increases correspondingly and the potential at the plate electrode 11a just increases slightly. Accordingly, the reliability of the device about the breakdown voltage is hardly affected.

In the inventive high-voltage semiconductor device, parts of a metal electrode are extended onto and interlevel dielectric film and are located over electrically floating plate electrodes formed on a field insulating film. And those parts of the metal electrode are capacitively coupled to the plate electrodes. Accordingly, the difference between a potential at part of a semiconductor region under each plate electrode and a drain voltage can be divided by a serial capacitor formed by these coupling capacitances, and an appropriate bias voltage can be applied to the floating plate electrode. Thus, a p-type inversion layer, which often appears under the surface of the semiconductor region, can be substantially eliminated. As a result, a highly reliable semiconductor device, having a breakdown voltage hardly decreasing even during a high-temperature bias test, can be obtained.

Also, where part of the metal electrode overlaps the entire upper surface of one of annular plate electrodes, which is closest to the drain region, via an interlevel dielectric film, potentials can be applied stably to the underlying semiconductor region even if the protective coating has partially lost its insulation properties due to a stress. As a result, the decrease in breakdown voltage is avoidable not only when the device is subjected to the high-temperature bias test but also where the protective coating has partially lost its insulation properties.

What is claimed is:

1. A semiconductor device with a high breakdown voltage, comprising:
   a semiconductor substrate of a first conductivity type;
   a semiconductor region of a second conductivity type, which is defined in the substrate;
   a drain region of the second conductivity type, which is defined approximately at the center of the semiconductor region;
   a body region of the first conductivity type, which is defined in the semiconductor region so as to be spaced apart from, and to surround, the drain region;
   a source region of the second conductivity type, which is defined in the body region;
   a gate insulating film deposited over the body region;
   a gate electrode formed on the gate insulating film;
   a field insulating film deposited over a part of the semiconductor region, the part being located between the body and drain regions;
   a metal electrode electrically connected to the drain region;
   a plurality of electrically floating plate electrodes, which are spaced apart from, and surround, the drain region when the device is viewed from over the substrate; and
   an interlevel dielectric film formed over the gate insulating film, the field insulating film and the floating plate electrodes,
   wherein parts of the metal electrode are extended onto the interlevel dielectric film and are located over the floating plate electrodes,
   wherein each said part of the metal electrode is capacitively coupled to an associated one of the floating plate electrodes, and
   wherein a plurality of girdling regions of the first conductivity type are defined in respective upper parts of the semiconductor region that are located directly under the plate electrodes.

2. The device of claim 1, wherein when the device is viewed from over the substrate, the drain region is approximately circular, while the plate electrodes are in the shape of rings that form concentric circles around the drain region, and
   wherein the metal electrode includes, as the extended parts, a plurality of annular metal electrodes that are formed over the plate electrodes with the interlayer dielectric film interposed therebetween, each said annular metal electrode being electrically connected to the drain region.

3. The device of claim 2,
   wherein the girdling regions are in the shape f rings that form concentric circles around the drain region.

4. The device of claim 1, wherein the metal electrode comprises a part that overlaps the entire upper surface of one of the plate electrodes, which is located closer to the drain region than any other one of the plate electrodes is, with the interlevel dielectric film interposed therebetween.

5. The device of claim 1, further comprising an isolating region of the first conductivity type that surrounds the semiconductor region,
   wherein the semiconductor region is electrically isolated using a junction formed between the semiconductor and isolating regions.

6. The device of claim 1, further comprising an isolating insulating film that surrounds the semiconductor region,
   wherein the semiconductor region is electrically isolated using the insulating film.

7. The device of claim 1, further comprising an insulating layer formed on the substrate of the first conductivity type,
   wherein the semiconductor region of the second conductivity type is defined on the insulating layer.

8. The device of claim 1, further comprising;
   a protective coating formed over the metal electrode and the interlevel dielectric film; and
   a plastic encapsulant formed on the protective coating.

* * * * *